United States Patent
Sun et al.

(10) Patent No.: US 10,216,976 B2
(45) Date of Patent: Feb. 26, 2019

(54) METHOD, DEVICE AND MEDIUM FOR FINGERPRINT IDENTIFICATION

(71) Applicant: Xiaomi Inc., Haidian District, Beijing (CN)

(72) Inventors: Changyu Sun, Beijing (CN); Zhijie Li, Beijing (CN); Wei Sun, Beijing (CN)

(73) Assignee: XIAOMI INC., Haidian District, Beijing ( * ) Notice: Subject to any disclaimer, the term of this patent is extended or adjusted under 35 U.S.C. 154(b) by 0 days.

(21) Appl. No.: 15/390,736

(22) Filed: Dec. 27, 2016

(65) Prior Publication Data

US 2017/0185820 A1 Jun. 29, 2017

(30) Foreign Application Priority Data

Dec. 29, 2015 (CN) .......................... 2015 1 1009131

(51) Int. Cl.
*G06K 9/00* (2006.01)
*G01R 31/28* (2006.01)
*G01R 31/44* (2006.01)

(52) U.S. Cl.
CPC ..... *G06K 9/00087* (2013.01); *G01R 31/2829* (2013.01); *G01R 31/44* (2013.01); *G06K 9/0002* (2013.01); *G06K 9/00013* (2013.01)

(58) Field of Classification Search
CPC ........... G06K 9/00067; G06K 9/00577; G06K 9/036; G06K 9/00013
USPC ....... 382/115, 116, 124, 128, 170, 171, 209, 382/218, 224, 278, 282; 340/5.53, 5.83
See application file for complete search history.

(56) References Cited

U.S. PATENT DOCUMENTS

| | | | | |
|---|---|---|---|---|
| 6,754,380 B1* | 6/2004 | Suzuki | ..................... | G06K 9/32 382/156 |
| 7,155,034 B1* | 12/2006 | Recce | ..................... | B60R 25/04 382/115 |
| 7,272,247 B2* | 9/2007 | Hamid | ................. | G06K 9/0002 382/124 |
| 7,711,158 B2* | 5/2010 | Ahn | ....................... | G06K 9/036 382/115 |
| 7,841,539 B2* | 11/2010 | Hewton | ................. | G06Q 20/04 235/380 |
| 7,869,635 B2* | 1/2011 | Hamid | ............... | G06K 9/00067 283/69 |

(Continued)

FOREIGN PATENT DOCUMENTS

CN 102693420 A 9/2012
CN 102708363 A 10/2012

(Continued)

OTHER PUBLICATIONS

Supplementary European Search Report in European application No. 16207364.7, dated May 26, 2017.

(Continued)

*Primary Examiner* — Yosef Kassa
(74) *Attorney, Agent, or Firm* — Jun He Law Offices P.C.; James J. Zhu

(57) ABSTRACT

A method, device and medium for fingerprint identification are provided. The method for fingerprint identification includes that: it is detected whether the number of damaged pixel units in a fingerprint identification sensor reaches a preset threshold value, and the damaged pixel units are physically damaged pixel units in the fingerprint identification sensor; and if the number of the damaged pixel units reaches the preset threshold value, identifying a fingerprint image acquired by the fingerprint identification sensor is stopped.

13 Claims, 9 Drawing Sheets

(56) References Cited

U.S. PATENT DOCUMENTS

| | | | |
|---|---|---|---|
| 7,965,874 B2* | 6/2011 | Abiko | G06K 9/0002 382/116 |
| 8,411,913 B2* | 4/2013 | Zhang | G06K 9/00093 382/125 |
| 8,644,566 B2* | 2/2014 | Abe | G06K 9/036 382/124 |
| 8,718,318 B2* | 5/2014 | Kim | G06K 9/00577 382/100 |
| 8,731,235 B2* | 5/2014 | Boyd | G06T 1/0021 382/100 |
| 2003/0042911 A1 | 3/2003 | Lane | |
| 2007/0177774 A1 | 8/2007 | Kuo | |
| 2007/0286464 A1 | 12/2007 | Jayanetti | |
| 2008/0208495 A1 | 8/2008 | Xu | |

FOREIGN PATENT DOCUMENTS

| | | | |
|---|---|---|---|
| CN | 104391635 A | 3/2015 | |
| CN | 104463132 A | 3/2015 | |
| CN | 105224931 A | 1/2016 | |
| EP | 1298591 A2 | 4/2003 | |
| WO | 2008103708 A1 | 8/2008 | |

OTHER PUBLICATIONS

International Search Report in international application No. PCT/CN2016/101873, dated Dec. 29, 2016.
The Written Opinion of the International Search Authority in international application No. PCT/CN2016/101873, dated Dec. 29, 2016.

* cited by examiner

METHOD, DEVICE AND MEDIUM FOR FINGERPRINT IDENTIFICATION

CROSS-REFERENCE TO RELATED APPLICATIONS

This application is filed based upon and claims priority to Chinese Patent Application No. 201511009131.7, filed on Dec. 29, 2015, the entire contents of which are incorporated herein by reference.

TECHNICAL FIELD

The present disclosure generally relates to fingerprint identification, and more particularly, to a method, device and medium for fingerprint identification.

BACKGROUND

A fingerprint identification technology has been widely applied to mobile terminals such as smart phones and tablet computers. M*N pixel units forming an array are arranged on a fingerprint identification sensor. According to the fingerprint identification technology, a fingerprint image of a user is acquired through each of the pixel units in the fingerprint identification sensor, and the acquired fingerprint image and a pre-stored fingerprint template are compared to match, thereby realizing functions of screen unlocking, mobile payment or the like.

A fingerprint of a user may change with age and season, so that a learning function is added to a fingerprint template in a related technology, thereby reducing a False Reject Rate (FRR) of a fingerprint identification sensor, the FRR referring to identifying the same fingerprint image into different fingerprint images. However, the learning function may add a pixel feature of a damaged pixel unit in the fingerprint identification sensor into the fingerprint template, and since the pixel feature is own feature of the fingerprint identification sensor, a False Accept Rate (FAR) of the fingerprint identification sensor is greatly increased, the FAR referring to identifying different fingerprint images into the same fingerprint image. Therefore, potential safety hazards of a mobile terminal may be incurred.

SUMMARY

According to a first aspect of the embodiment of the present disclosure, there is provided a method for fingerprint identification. The method includes: it is detected whether the number of damaged pixel units in a fingerprint identification sensor reaches a preset threshold value, and the damaged pixel units are physically damaged pixel units in the fingerprint identification sensor; and if the number of the damaged pixel units reaches the preset threshold value, identifying a fingerprint image acquired by the fingerprint identification sensor is stopped.

According to a second aspect of the embodiment of the present disclosure, there is provided a device for fingerprint identification. The device includes: a processor; and a memory configured to store instructions executable by the processor, wherein the processor may be configured to: detect whether the number of damaged pixel units in a fingerprint identification sensor reaches a preset threshold value, and the damaged pixel units are physically damaged pixel units in the fingerprint identification sensor; and if the number of the damaged pixel units reaches the preset threshold value, stop identifying a fingerprint image acquired by the fingerprint identification sensor.

According to a third aspect of the embodiment of the present disclosure, there is provided a non-transitory computer-readable storage medium having stored therein instructions that, when executed by a processor of a mobile terminal, causes the mobile terminal to perform a method for fingerprint identification, and the method includes: detecting whether the number of damaged pixel units in a fingerprint identification sensor reaches a preset threshold value, and the damaged pixel units are physically damaged pixel units in the fingerprint identification sensor; and stopping identifying a fingerprint image acquired by the fingerprint identification sensor if the number of the damaged pixel units reaches the preset threshold value.

It should be understood that the foregoing general description and the following detailed description are only exemplary and explanatory only and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the specification, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with some aspects related to the present disclosure as recited in the appended claims.

Figure 1:
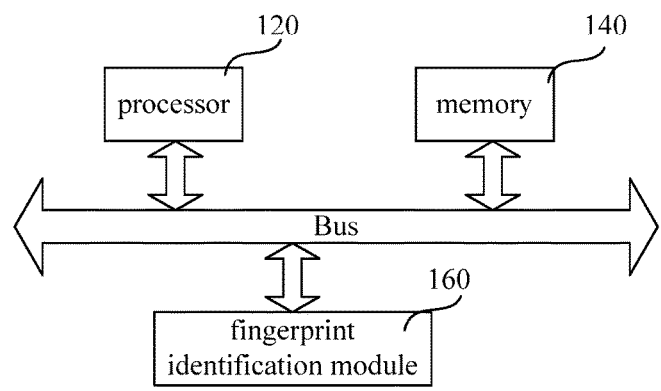
FIG. 1 is a hardware structure diagram of a mobile terminal, according to an exemplary embodiment.

FIG. 1 is a hardware structure diagram of a mobile terminal, according to an exemplary embodiment. As shown in FIG. 1, the mobile terminal may be a terminal such as a smart phone, a tablet computer and an electronic book reader. The mobile terminal includes a processor 120, and a memory 140 and fingerprint identification module 160 connected with the processor 120 respectively.

The memory 140 has instructions executable by the processor 120 stored therein.

The fingerprint identification module 160 is also called a fingerprint identification sensor. The fingerprint identification module 160 includes pixel units (not shown in the figure) arranged in an array. Each of the pixel units in the fingerprint identification module 160 is configured to acquire a fingerprint image of a user. The fingerprint identification module 160 matches the fingerprint image acquired by each pixel unit and a pre-stored fingerprint template to realize functions of screen unlocking, mobile payment or the like of the mobile terminal.

Figure 2:
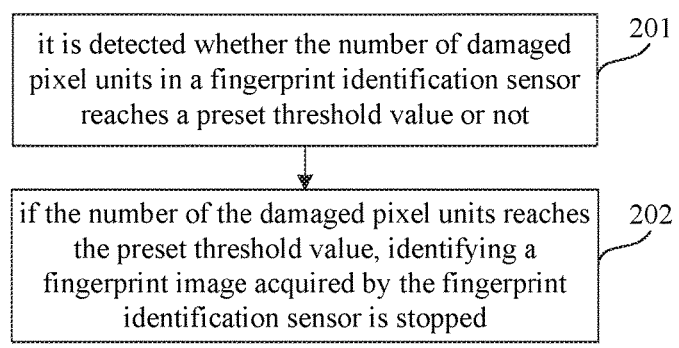
FIG. 2 is a flow chart showing a method for fingerprint identification, according to an exemplary embodiment.

FIG. 2 is a flow chart showing a method for fingerprint identification, according to an exemplary embodiment, and as shown in FIG. 2, the method for fingerprint identification is applied to the mobile terminal shown in FIG. 1, and the method for fingerprint identification may include the following steps.

At Step 201, it is detected whether the number of damaged pixel units in a fingerprint identification sensor reaches a preset threshold value.

Pixel units refer to pixels arranged in an array in the fingerprint identification sensor. The pixel units are configured to acquire pixel points of a fingerprint image of a user.

The damaged pixel units refer to physically damaged pixel units in the fingerprint identification sensor.

The damaged pixel units refer to physically damaged pixel units in the pixel units arranged in an array.

At Step 202, if the number of the damaged pixel units reaches the preset threshold value, identifying a fingerprint image acquired by the fingerprint identification sensor is stopped.

From the above, according to the method for fingerprint identification provided by the embodiment of the present disclosure, whether the number of the damaged pixel units in the fingerprint identification sensor reaches the preset threshold value is detected, and the damaged pixel units are the physically damaged pixel units in the fingerprint identification sensor, and if the number of the damaged pixel units reaches the preset threshold value, identifying the fingerprint image acquired by the fingerprint identification sensor is stopped, so that it avoids potential safety hazards of the mobile terminal caused by the fact that a learning function may add a pixel feature of a damaged pixel unit in the fingerprint identification sensor into a fingerprint template to greatly increase an FAR of the fingerprint identification sensor, reduces the FAR of the fingerprint identification sensor and avoids potential safety hazards of the mobile terminal caused by excessively high FAR.

Figure 3A:
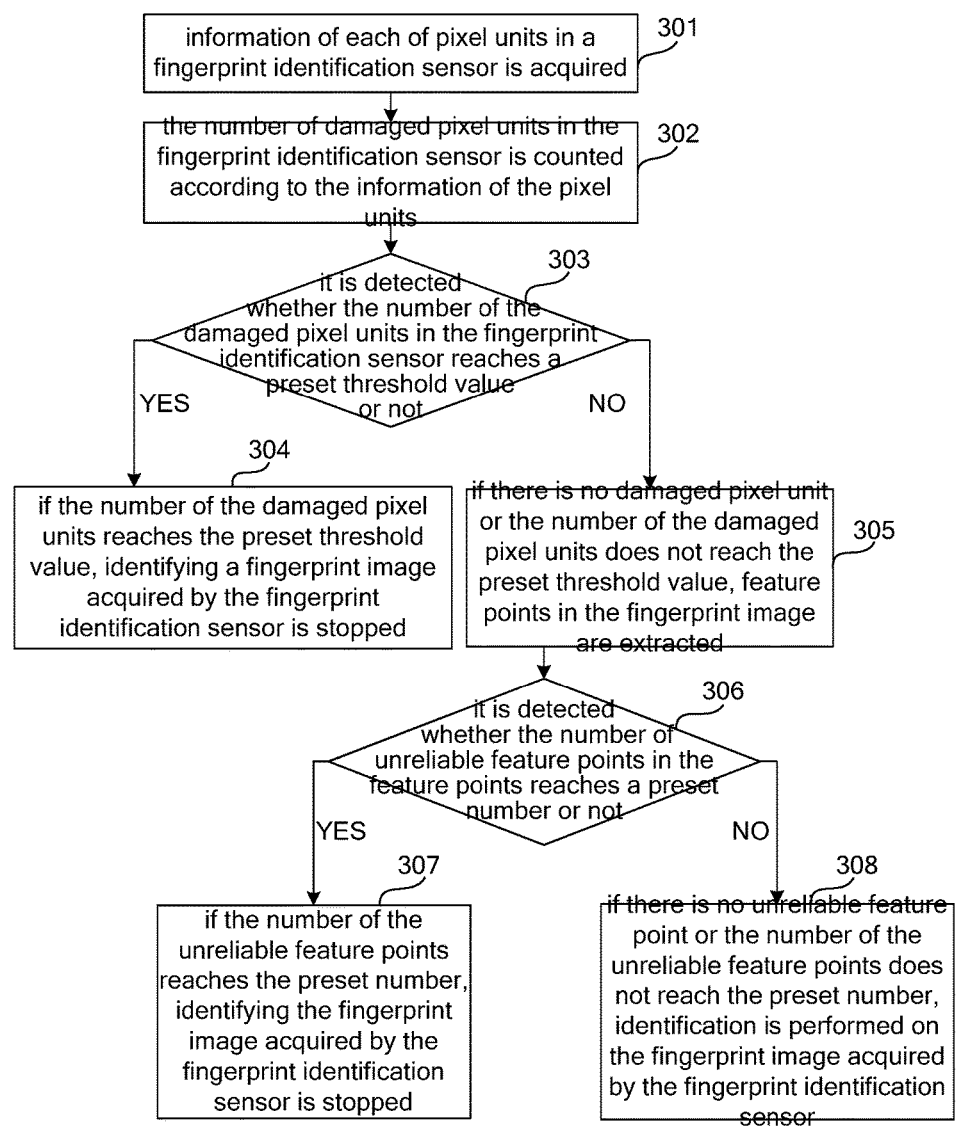
FIG. 3A is a flow chart showing a method for fingerprint identification, according to another exemplary embodiment.

FIG. 3A is a flow chart showing a method for fingerprint identification, according to another exemplary embodiment, and as shown in FIG. 3A, the method for fingerprint identification is applied to the mobile terminal shown in FIG. 1, and the method for fingerprint identification may include the following steps.

At Step 301, information of each of pixel units in a fingerprint identification sensor is acquired.

The pixel units refer to pixels arranged in an array in the fingerprint identification sensor. The pixel units are configured to acquire pixel points of a fingerprint image of a user.

The mobile terminal acquires the information of each pixel unit in the fingerprint identification sensor at first before using the fingerprint identification sensor.

Optionally, every time when the mobile terminal is powered on for use, the information of each of the pixel units in the fingerprint identification sensor is acquired at first.

At Step 302, the number of damaged pixel units in the fingerprint identification sensor is counted according to the information of the pixel units.

The mobile terminal counts the number of the damaged pixel units in the fingerprint identification sensor according to the information of each of the pixel units after acquiring the information of each of the pixel unit.

The damaged pixel units refer to physically damaged pixel units in the fingerprint identification sensor.

The damaged pixel units are physically damaged pixel units in the pixel units arranged in the array.

The pixel units in the fingerprint identification sensor may be physically damaged due to an external factor such as static electricity and external pressure. Pixel points acquired by these physically damaged pixel units may miss to different extents.

Herein, the step that the number of the damaged pixel units in the fingerprint identification sensor is counted may include the following sub-steps: a pixel feature of each of the pixel units in the fingerprint image acquired by the fingerprint identification sensor in a preset photographic environment is acquired, the pixel feature at least including a brightness value and/or a contrast; it is detected whether there are pixel units of which pixel features belong to a first numerical value range in the fingerprint identification sensor; and the number of the pixel units belonging to the first numerical value range in the fingerprint identification sensor is counted.

Herein, the first numerical value range refers to a value range corresponding to the pixel features of the damaged pixel units; and the number of the pixel units belonging to the first numerical value range is the number of the damaged pixel units.

It is supposed that a pixel feature acquired by a pixel unit is black when a high voltage is input into the fingerprint identification sensor and the pixel feature acquired by the pixel unit is white when a low voltage is input into the fingerprint identification sensor under a regular condition. If the pixel feature acquired by the pixel unit is white when the high voltage is input into the fingerprint identification sensor, the pixel unit is determined to be a damaged pixel unit.

Optionally, a template of a fingerprint image acquired by the physically damaged pixel units is pre-stored in the fingerprint identification sensor, and the fingerprint image acquired by the fingerprint identification sensor is compared with the template of the fingerprint image acquired by the damaged pixel units to count the number of the damaged pixel units.

At Step 303, it is whether the number of the damaged pixel units in the fingerprint identification sensor reaches a preset threshold value.

After the number of the damaged pixel units in the fingerprint identification sensor is counted, the counted number is compared with the preset threshold value to detect whether the counted number of the damaged pixel units reaches the preset threshold value.

At Step 304, if the number of the damaged pixel units reaches the preset threshold value, identifying a fingerprint image acquired by the fingerprint identification sensor is stopped.

If the counted number of the damaged pixel units reaches the preset threshold value, the fingerprint identification sensor stops identifying the acquired fingerprint image.

Optionally, if the counted number of the damaged pixel units reaches the preset threshold value, the fingerprint identification sensor sends prompting information to the mobile terminal to prompt the user that the fingerprint identification sensor has been damaged.

Figure 3B:
FIG. 3B is a diagram of prompting information sent by a fingerprint identification sensor, according to an exemplary embodiment.

As shown in FIG. 3B, the mobile terminal receives the prompting information sent by the fingerprint identification sensor, wherein a content of the prompting information is: "the pixel units in the fingerprint identification sensor have been damaged, please timely repair them".

At Step 305, if there is no damaged pixel unit or the number of the damaged pixel units does not reach the preset threshold value, feature points in the fingerprint image are extracted.

If there is no damaged pixel unit, the feature points in the fingerprint image acquired by the fingerprint identification sensor are extracted.

Optionally, if the counted number of the damaged pixel units does not reach the preset threshold value, the feature points in the fingerprint image acquired by the fingerprint identification sensor are extracted.

The feature points of the fingerprint image are features formed by information of the pixel points acquired by at least one pixel unit. Therefore, the feature points of the fingerprint image may be information of the pixel point acquired by one pixel unit, and may also be one feature formed by information of fingerprint images acquired by multiple pixel units in the fingerprint image.

For example, a starting point of the fingerprint image, an endpoint of the fingerprint image, a bifurcation point of the fingerprint image and a joint of the fingerprint image are taken as feature points of the fingerprint image.

For example, fingerprint images acquired by 10 adjacent pixel units in the fingerprint image are combined, and the combination is taken as one feature point of the fingerprint image.

At Step 306, it is detected whether the number of unreliable feature points in the feature points reaches a preset number.

The unreliable feature points are feature points acquired by the damaged pixel units or pixel units in an abnormal working state.

The damaged pixel units refer to the physically damaged pixel units in the fingerprint identification sensor; and the pixel units in the abnormal working state refer to pixel units which are not physically damaged but may become abnormal when acquiring pixel points in the fingerprint identification sensor.

There is no inclusion relationship between the damaged pixel units and the pixel units in the abnormal working state, and they are different pixel units.

Herein, the step that the number of the unreliable feature points in the feature points of the fingerprint image is counted may include the following sub-steps: each feature point of the fingerprint image acquired by the fingerprint identification sensor in the preset photographic environment is acquired; and the number of feature points belonging to a second numerical value range in the feature points in the fingerprint identification sensor is counted.

Herein, the second numerical value range refers to a value range corresponding to the unreliable feature points; and the feature points belonging to the second numerical value range are the unreliable feature points.

The unreliable feature points are features formed by information of the pixel points acquired by at least one damaged pixel unit. Therefore, the unreliable feature points may be information of the pixel point acquired by one damaged pixel unit or pixel unit in the abnormal working state, and may also be one feature formed by information of fingerprint images acquired by multiple damaged pixel units or pixel units in the abnormal working state in the fingerprint image.

For example, a fingerprint image acquired by multiple damaged pixel units may have black and white stripe information. Therefore, the black and white stripe information is taken as an unreliable feature point.

Optionally, an unreliable feature point template of the fingerprint image acquired by the physically damaged pixel units is pre-stored in the fingerprint identification sensor, and the extracted feature points in the fingerprint image are compared with the unreliable feature point template to count the number of the unreliable feature points in the feature points of the fingerprint image to detect whether the number of the unreliable feature points in the feature points of the fingerprint image reaches the preset number.

At Step 307, if the number of the unreliable feature points reaches the preset number, identifying the fingerprint image acquired by the fingerprint identification sensor is stopped.

If the counted number of the unreliable feature points reaches the preset number, the fingerprint identification sensor stops identifying the acquired fingerprint image.

Optionally, if the counted number of the unreliable feature points reaches the preset number, the fingerprint identification sensor sends prompting information to the mobile terminal to prompt the user that the fingerprint identification sensor has been damaged, as shown in FIG. 3B.

At Step 308, if there is no unreliable feature point or the number of the unreliable feature points does not reach the preset number, identification is performed on the fingerprint image acquired by the fingerprint identification sensor.

If there is no unreliable feature point, identification is performed on the fingerprint image acquired by the fingerprint identification sensor.

Optionally, if the counted number of the unreliable feature points does not reach the preset number, identification is performed on the fingerprint image acquired by the fingerprint identification sensor.

From the above, according to the method for fingerprint identification provided by the embodiment of the present disclosure, it is detected whether the number of the damaged pixel units in the fingerprint identification sensor reaches the preset threshold value, and the damaged pixel units are the physically damaged pixel units in the fingerprint identification sensor, and if the number of the damaged pixel units reaches the preset threshold value, identifying the fingerprint image acquired by the fingerprint identification sensor is stopped, so that it avoids potential safety hazards of the mobile terminal caused by the fact that a learning function may add a pixel feature of a damaged pixel unit in the fingerprint identification sensor into a fingerprint template to greatly increase an FAR of the fingerprint identification sensor, reduces the FAR of the fingerprint identification sensor and avoids potential safety hazards of the mobile terminal caused by excessively high FAR are achieved.

In addition, the damaged pixel units are double-determined by extracting the feature points in the fingerprint image and detecting whether the number of the unreliable feature points in the fingerprint image reaches the preset number, so that the FAR of the fingerprint identification sensor is greatly increased.

It is noted that, as a possible implementation mode, when it is detected that the number of the damaged pixel units reaches the preset threshold value, the fingerprint images acquired by the damaged pixel points in the fingerprint identification sensor are removed and identification is performed on the fingerprint image left after removal.

Figure 4A:
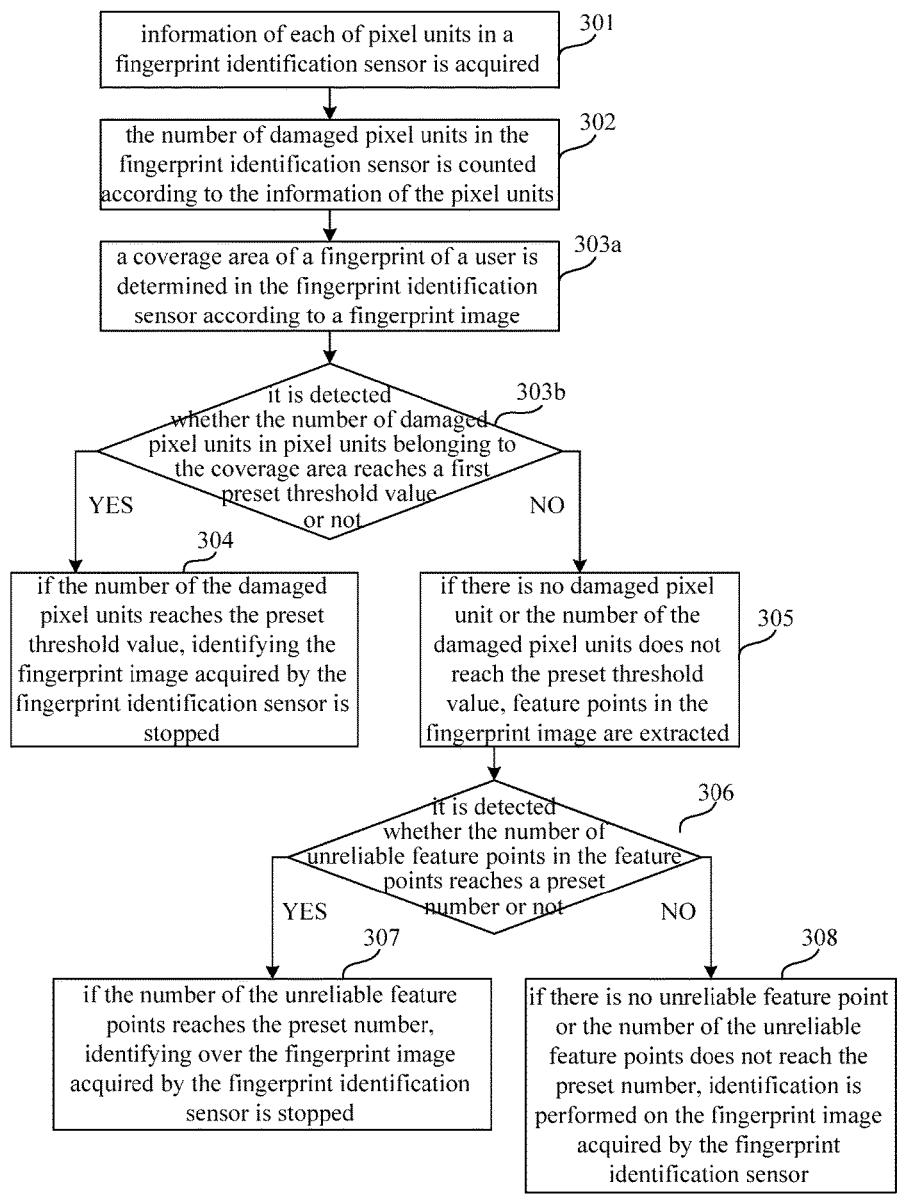
FIG. 4A is a flow chart showing a method for fingerprint identification, according to another exemplary embodiment.

All the pixel units in the fingerprint identification sensor are detected in the method for fingerprint identification shown in FIG. 3A. Optionally, only pixel units in a coverage area of a fingerprint of the user may be detected, and Step 303 in the embodiment shown in FIG. 3A may be replaced with Step 303a and Step 303b as follows, as shown in FIG. 4A. The steps are specifically as follows.

At Step 303a, a coverage area of a fingerprint of a user is determined in the fingerprint identification sensor according to the fingerprint image.

The coverage area of the fingerprint of the user is determined in the acquired fingerprint image according to the fingerprint image acquired by the fingerprint identification sensor. That is, the pixel units which acquire the fingerprint image of the user in the fingerprint identification sensor are determined.

At Step 303b, it is detected whether the number of damaged pixel units in pixel units belonging to the coverage area reaches a first preset threshold value.

After the pixel units which acquire the fingerprint image of the user in the fingerprint identification sensor are determined, the number of the damaged pixel units in the pixel units belonging to the coverage area is counted, and the counted number is compared with the first preset threshold value to detect whether the number of the damaged pixel units in the pixel units belonging to the coverage area reaches the first preset threshold value.

From the above, according to the method for fingerprint identification provided by the embodiment of the present disclosure, only the number of the damaged pixel units belonging to the coverage area of the fingerprint of the user is detected, so that a detection range is narrowed, and a calculation process for detection is reduced.

Figure 4B:
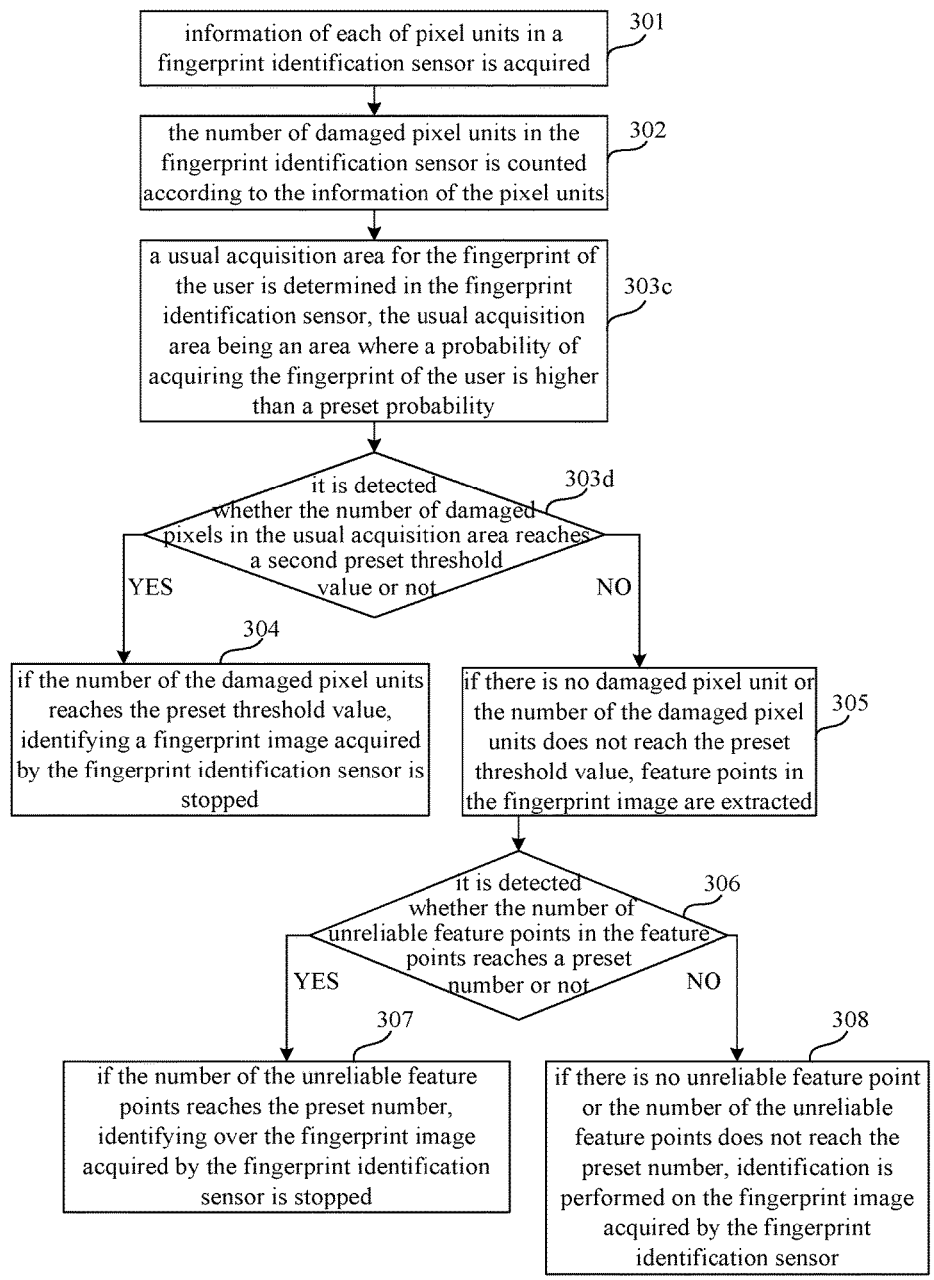
FIG. 4B is a flow chart showing a method for fingerprint identification, according to another exemplary embodiment.

All the pixel units in the fingerprint identification sensor are detected in the method for fingerprint identification shown in FIG. 3A. Optionally, only pixel units of a usual acquisition area for the fingerprint of the user may be detected, and Step 303 in the embodiment shown in FIG. 3A may be replaced with Step 303c and Step 303d as follows, as shown in FIG. 4B. The steps are specifically as follows.

At Step 303c, a usual acquisition area for the fingerprint of the user is determined in the fingerprint identification sensor, the usual acquisition area being an area where a probability of acquiring the fingerprint of the user is higher than a preset probability.

Information such as a habit of the user in using the fingerprint identification sensor and a fingerprint size of the user is analyzed to determine the usual acquisition area for the fingerprint of the user in the fingerprint identification sensor, that is, pixel units where probabilities of acquiring the fingerprint of the user are higher than the preset probability in the fingerprint identification sensor are determined.

At Step 303d, it is detected whether the number of damaged pixels in the usual acquisition area reaches a second preset threshold value.

After the pixel units where the probabilities of acquiring the fingerprint of the user are higher than the preset probability in the fingerprint identification sensor are determined, the number of the damaged pixels in pixel units belonging to the usual acquisition area is counted, and the counted number is compared with the second preset threshold value to detect whether the number of the damaged pixel units in the pixel units belonging to the usual acquisition area reaches the second preset threshold value.

From the above, according to the method for fingerprint identification provided by the embodiment of the present disclosure, only the number of the damaged pixel units belonging to the usual acquisition area for the fingerprint of the user is detected, so that the detection range is narrowed, and the calculation process for detection is reduced.

Figure 4C:
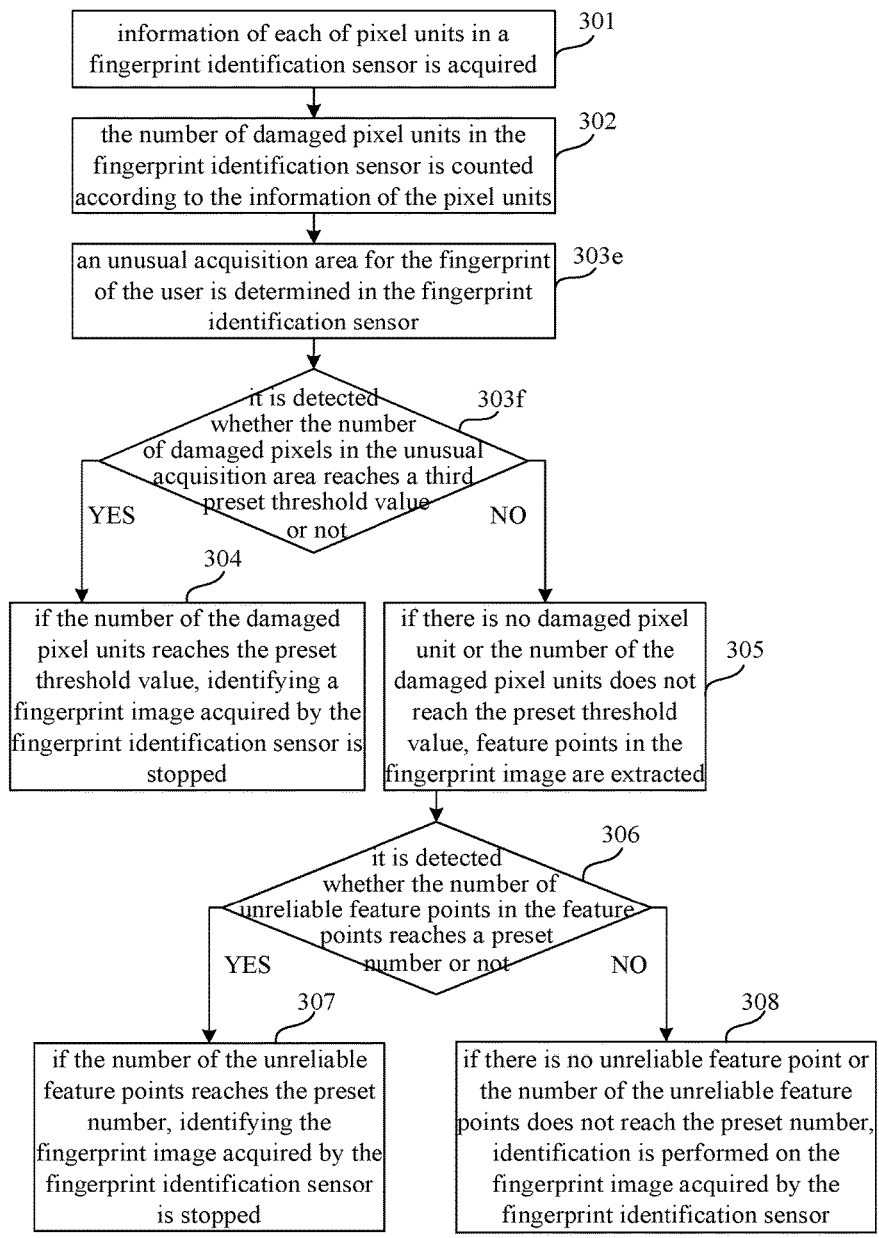
FIG. 4C is a flow chart showing a method for fingerprint identification, according to another exemplary embodiment.

All the pixel units in the fingerprint identification sensor are detected in the method for fingerprint identification shown in FIG. 3A. Optionally, only pixel units of an unusual acquisition area for the fingerprint of the user may be detected only, and Step 303 in the embodiment shown in FIG. 3A may be replaced with Step 303e and Step 303f as follows, as shown in FIG. 4C. The steps are specifically as follows.

At Step 303e, an unusual acquisition area for the fingerprint of the user is determined in the fingerprint identification sensor.

The unusual acquisition area is an area other than a usual acquisition area and the usual acquisition area is an area where a probability of acquiring the fingerprint of the user is higher than a preset probability.

Information such as a habit of the user in using the fingerprint identification sensor and a fingerprint size of the user is analyzed to determine the unusual acquisition area for the fingerprint of the user in the fingerprint identification sensor.

Herein, the unusual acquisition area refers to the area other than the usual coverage area, and the usual acquisition area is the area where the probability of acquiring the fingerprint of the user is higher than the preset probability.

That is, pixel units where probabilities of acquiring the fingerprint of the user are lower than the preset probability in the fingerprint identification sensor are determined.

At Step 303f, it is detected whether the number of damaged pixels in the unusual acquisition area reaches a third preset threshold value.

After the pixel units where the probabilities of acquiring the fingerprint of the user are lower than the preset probability in the fingerprint identification sensor are determined, the number of the damaged pixel units in the pixel units belonging to the unusual acquisition area is counted, and the counted number is compared with the third preset threshold value to detect whether the number of the damaged pixel units in the pixel units belonging to the unusual acquisition area reaches the third preset threshold value.

Figure 4D:
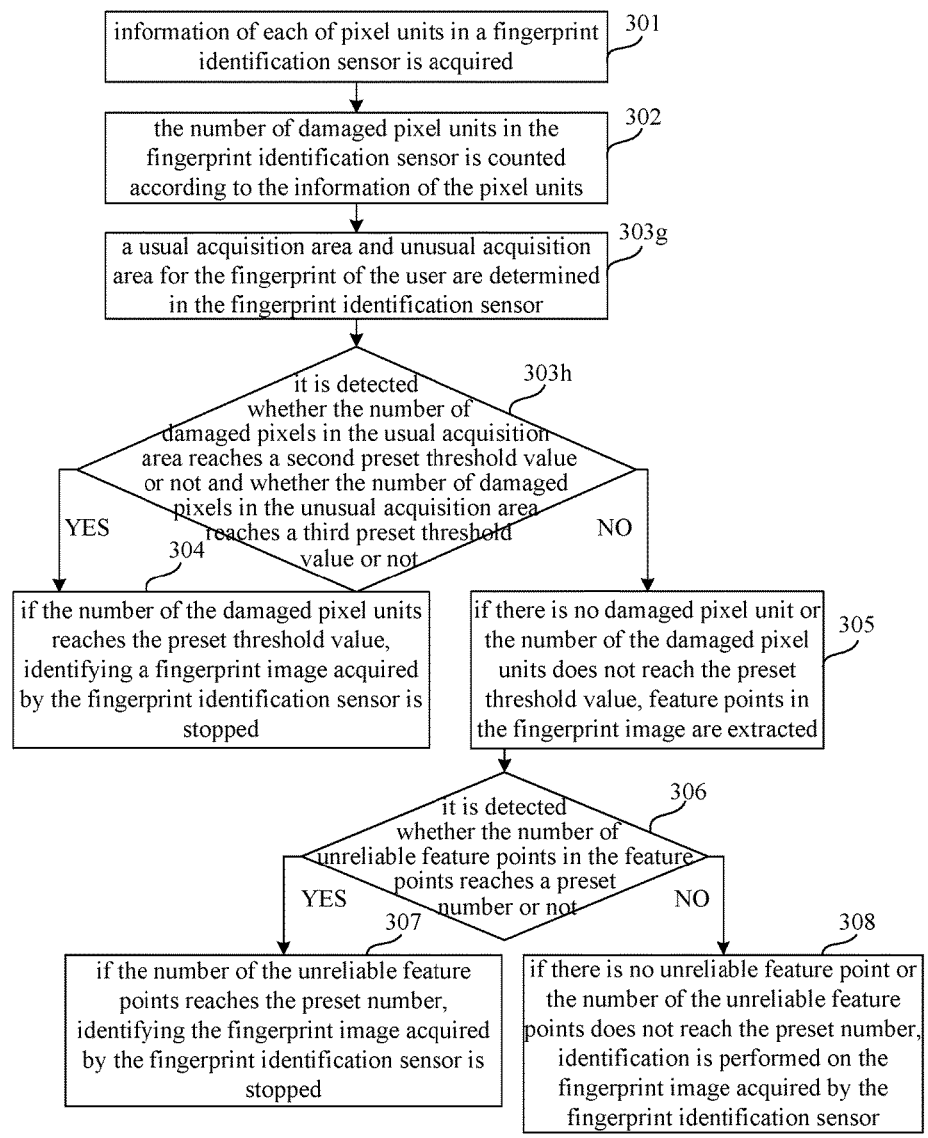
FIG. 4D is a flow chart showing a method for fingerprint identification, according to another exemplary embodiment.

According to the method for fingerprint identifications shown in FIG. 4B and FIG. 4C, a usual acquisition area and an unusual acquisition area may be detected at the same time, and Step 303 in the embodiment shown in FIG. 3A may be replaced with Step 303g and Step 303h as follows, as shown in FIG. 4D. The steps are specifically as follows.

At Step 303g, a usual acquisition area and unusual acquisition area for the fingerprint of the user are determined in the fingerprint identification sensor.

The usual acquisition area is an area where a probability of acquiring the fingerprint of the user is higher than a preset probability and the unusual acquisition area is an area other than the usual acquisition area.

Information such as a habit of the user in using the fingerprint identification sensor and a fingerprint size of the user is analyzed to determine the usual acquisition area and unusual acquisition area for the fingerprint of the user in the fingerprint identification sensor.

That is, pixel units where probabilities of acquiring the fingerprint of the user are higher than a preset probability in the fingerprint identification sensor are determined to be pixel units in the usual acquisition area; and pixel units where probabilities of acquiring the fingerprint of the user are lower than the preset probability in the fingerprint identification sensor are determined to be pixel units in the unusual acquisition area.

At Step 303h, it is detected whether the number of damaged pixels in the usual acquisition area reaches a second preset threshold value and whether the number of damaged pixels in the unusual acquisition area reaches a third preset threshold value.

Herein, the third preset threshold value is greater than the second preset threshold value.

After the pixel units of the usual acquisition area and the unusual acquisition area for the fingerprint of the user are determined, the numbers of damaged pixel units in the pixel units of the usual acquisition area and the pixel units of the unusual acquisition area are counted respectively, and the counted number of the damaged pixel units in the pixel units of the usual acquisition area is compared with the second preset threshold value to detect whether the number of the damaged pixel units in the pixel units belonging to the usual acquisition area reaches the second preset threshold value; and the counted number of the damaged pixel units in the pixel units of the unusual acquisition area is compared with the third preset threshold value to detect whether the number of the damaged pixel units in the pixel units belonging to the unusual acquisition area reaches the third preset threshold value.

A device embodiment of the present disclosure is described below, and may be configured to execute the method embodiments of the present disclosure. Details undisclosed in the device embodiment of the present disclosure refer to the method embodiments of the present disclosure.

Figure 5:
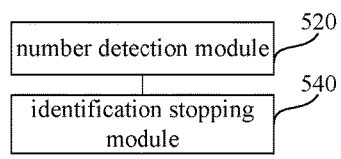
FIG. 5 is a block diagram of a device for fingerprint identification, according to an exemplary embodiment.

FIG. 5 is a block diagram of a device for fingerprint identification, according to an exemplary embodiment, and as shown in FIG. 5, the device for fingerprint identification is applied to the mobile terminal shown in FIG. 1, and the device for fingerprint identification includes: a number detection module 520 configured to detect whether the number of damaged pixel units in a fingerprint identification sensor reaches a preset threshold value, and the damaged pixel units are to physically damaged pixel units in the fingerprint identification sensor; and an identification stopping module 540 configured to, if the number of the damaged pixel units reaches the preset threshold value, stop identifying a fingerprint image acquired by the fingerprint identification sensor.

From the above, according to the device for fingerprint identification provided by the embodiment of the present disclosure, it is detected whether the number of the damaged pixel units in the fingerprint identification sensor reaches the preset threshold value, and the damaged pixel units are the physically damaged pixel units in the fingerprint identification sensor, and if the number of the damaged pixel units reaches the preset threshold value, identifying the fingerprint image acquired by the fingerprint identification sensor is stopped, so that it avoids potential safety hazards of the mobile terminal caused by the fact that a learning function may add a pixel feature of a damaged pixel unit in the fingerprint identification sensor into a fingerprint template to greatly increase an FAR of the fingerprint identification sensor, reduces the FAR of the fingerprint identification sensor and avoids potential safety hazards of the mobile terminal caused by excessively high FAR are achieved.

Figure 6:
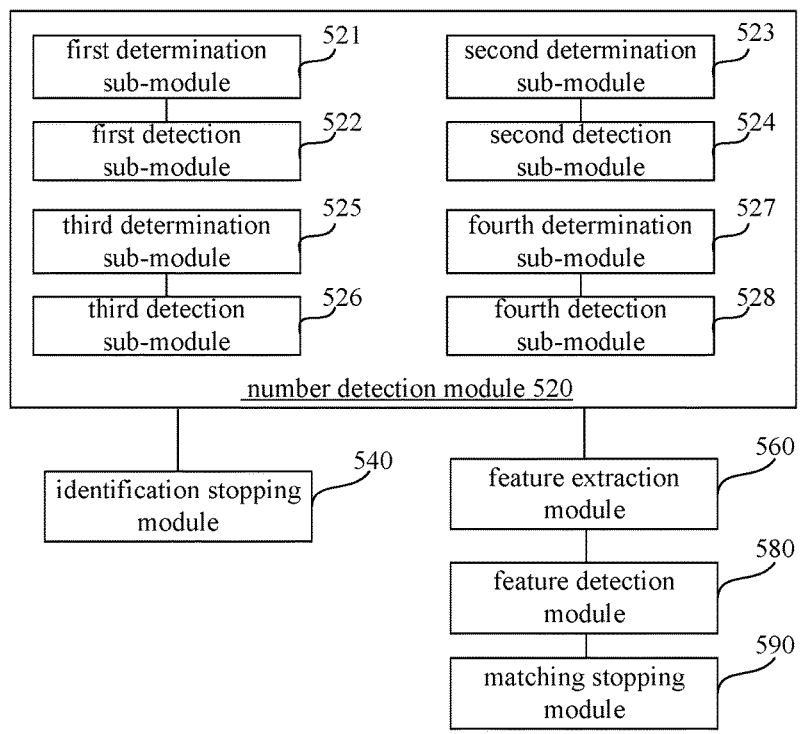
FIG. 6 is a block diagram of a device for fingerprint identification, according to another exemplary embodiment.

FIG. 6 is a block diagram of a device for fingerprint identification, according to another exemplary embodiment, and as shown in FIG. 6, the device for fingerprint identification is applied to the mobile terminal shown in FIG. 1, and the device for fingerprint identification includes: a number detection module 520, configured to detect whether the number of damaged pixel units in a fingerprint identification sensor reaches a preset threshold value, and the damaged pixel units are physically damaged pixel units in the fingerprint identification sensor.

As a first possible implementation mode, the number detection module 520 in the embodiment may include: a first determination sub-module 521 and a first detection sub-module 522.

The first determination sub-module 521 is configured to determine a coverage area of a fingerprint of a user in the fingerprint identification sensor according to a fingerprint image.

The first detection sub-module 522 is configured to detect whether the number of damaged pixel units in pixel units belonging to the coverage area reaches a first preset threshold value.

As a second possible implementation mode, the number detection module 520 in the embodiment may include: a second determination sub-module 523 and a second detection sub-module 524.

The second determination sub-module 523 is configured to determine a usual acquisition area for the fingerprint of the user in the fingerprint identification sensor, the usual acquisition area being an area where a probability of acquiring the fingerprint of the user is higher than a preset probability.

The second detection sub-module 524 is configured to detect whether the number of damaged pixels in the usual acquisition area reaches a second preset threshold value.

As a third possible implementation mode, the number detection module 520 in the embodiment may include: a third determination sub-module 525 and a third detection sub-module 526.

The third determination sub-module 525 is configured to determine an unusual acquisition area for the fingerprint of the user in the fingerprint identification sensor, the unusual acquisition area being an area other than a usual acquisition area and the usual acquisition area being an area where a probability of acquiring the fingerprint of the user is higher than a preset probability.

The third detection sub-module 526 is configured to detect whether the number of damaged pixels in the unusual acquisition area reaches a third preset threshold value.

As a fourth possible implementation mode, the number detection module 520 in the embodiment may include: a fourth determination sub-module 527 and a fourth detection sub-module 528.

The fourth determination sub-module 527 is configured to determine a usual acquisition area and unusual acquisition area for the fingerprint of the user in the fingerprint identification sensor, the usual acquisition area being an area where a probability of acquiring the fingerprint of the user is higher than a preset probability and the unusual acquisition area being an area other than the usual acquisition area.

The fourth detection sub-module 528 is configured to detect whether the number of damaged pixels in the usual acquisition area reaches a second preset threshold value and whether the number of damaged pixels in the unusual acquisition area reaches a third preset threshold value.

The third preset threshold is greater than the second preset threshold value.

An identification stopping module 540 is configured to, if the number of the damaged pixel units reaches the preset threshold value, stop identifying the fingerprint image acquired by the fingerprint identification sensor.

Optionally, the device in the embodiment may further include: a feature extraction module 560, a feature detection module 580 and a matching stopping module 590.

The feature extraction module 560 is configured to, if there is no damaged pixel unit or the number of the damaged pixel units does not reach the preset threshold value, extract feature points in the fingerprint image.

The feature detection module 580 is configured to detect whether the number of unreliable feature points in the feature points reaches a preset number, the unreliable feature points being feature points acquired by the damaged pixel units or pixel units in an abnormal working state.

The matching stopping module 590 is configured to, if the number of the unreliable feature points reaches the preset number, stop identifying the fingerprint image acquired by the fingerprint identification sensor.

From the above, according to the device for fingerprint identification provided by the embodiment of the present disclosure, it is detected whether the number of the damaged pixel units in the fingerprint identification sensor reaches the preset threshold value, and the damaged pixel units are the physically damaged pixel units in the fingerprint identification sensor, and if the number of the damaged pixel units reaches the preset threshold value, identifying the fingerprint image acquired by the fingerprint identification sensor is stopped, so that it avoids potential safety hazards of the mobile terminal caused by the fact that a learning function may add a pixel feature of a damaged pixel unit in the fingerprint identification sensor into a fingerprint template to greatly increase an FAR of the fingerprint identification sensor, reduces the FAR of the fingerprint identification sensor and avoids potential safety hazards of the mobile terminal caused by excessively high FAR are achieved.

In addition, the damaged pixel units are double-determined by extracting the feature points in the fingerprint image and detecting whether the number of the unreliable feature points in the fingerprint image reaches the preset number, so that the FAR of the fingerprint identification sensor is greatly increased.

With respect to the devices in the above embodiments, the specific manners for performing operations for individual modules therein have been described in detail in the embodiments regarding the methods, which will not be elaborated herein.

An exemplary embodiment of the present disclosure provides a device for fingerprint identification, which may implement the method for fingerprint identification provided by the present disclosure, and the device for fingerprint identification includes: a processor and a memory configured to store instructions executable by the processor.

The processor is configured to: detect whether the number of damaged pixel units in a fingerprint identification sensor reaches a preset threshold value, and the damaged pixel units are physically damaged pixel units in the fingerprint identification sensor; and if the number of the damaged pixel units reaches the preset threshold value, stop identifying a fingerprint image acquired by the fingerprint identification sensor.

Figure 7:
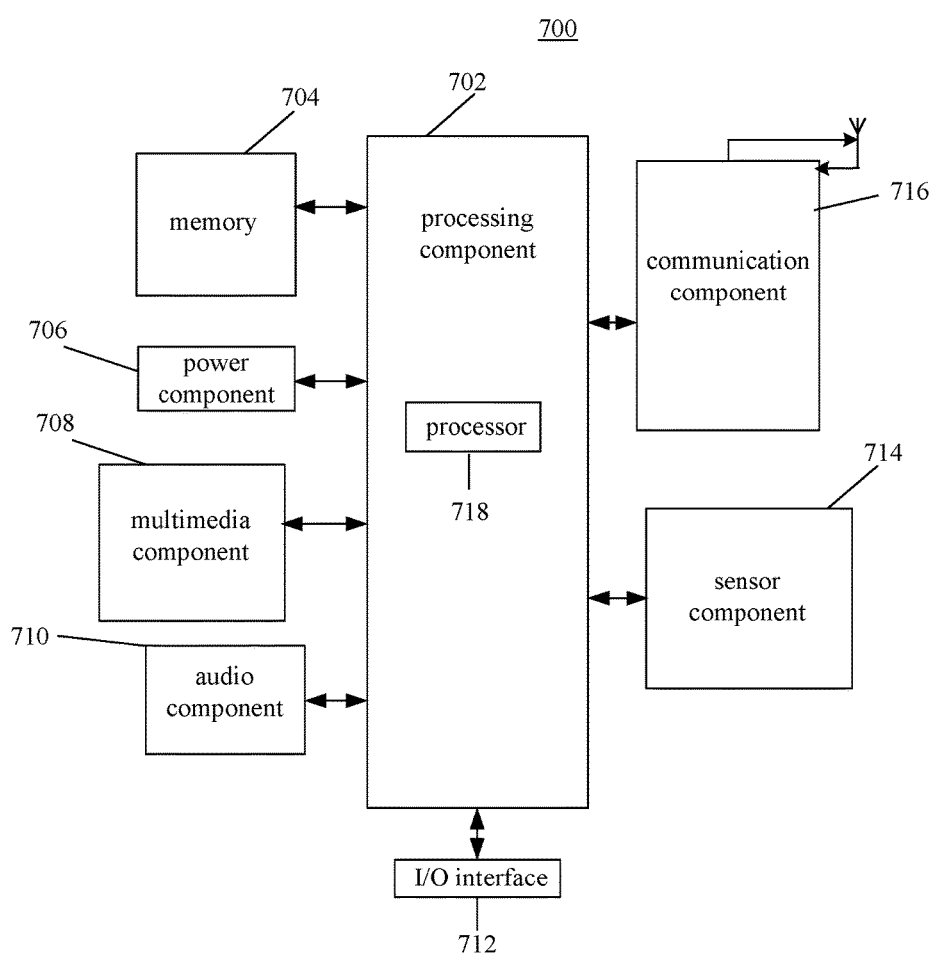
FIG. 7 is a block diagram of a device for fingerprint identification, according to still another exemplary embodiment.

FIG. 7 is a block diagram of a device for fingerprint identification, according to an exemplary embodiment. For example, the device 700 may be a mobile phone, a computer, a digital broadcast terminal, a messaging device, a gaming console, a tablet, a medical device, exercise equipment, a personal digital assistant or the like.

Referring to FIG. 7, the device 700 may include one or more of the following components: a processing component 702, a memory 704, a power component 706, a multimedia component 708, an audio component 710, an Input/Output (I/O) interface 712, a sensor component 714, and a communication component 716.

The processing component 702 typically controls overall operations of the device 700, such as the operations associated with display, telephone calls, data communications, camera operations, and recording operations. The processing component 702 may include one or more processors 718 to execute instructions to perform all or part of the steps in the abovementioned method. Moreover, the processing component 702 may include one or more modules which facilitate interaction between the processing component 702 and the other components. For instance, the processing component 702 may include a multimedia module to facilitate interaction between the multimedia component 708 and the processing component 702.

The memory 704 is configured to store various types of data to support the operation of the device 700. Examples of such data include instructions for any application programs or methods operated on the device 700, contact data, phonebook data, messages, pictures, video, etc. The memory 704 may be implemented by any type of volatile or non-volatile memory devices, or a combination thereof, such as a Static Random Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, and a magnetic or optical disk.

The power component 706 provides power for various components of the device 700. The power component 706 may include a power management system, one or more power supplies, and other components associated with the generation, management and distribution of power for the device 700.

The multimedia component 708 includes a screen providing an output interface between the device 700 and a user. In some embodiments, the screen may include a Liquid Crystal Display (LCD) and a Touch Panel (TP). If the screen includes the TP, the screen may be implemented as a touch screen to receive an input signal from the user. The TP includes one or more touch sensors to sense touches, swipes and gestures on the TP. The touch sensors may not only sense a boundary of a touch or swipe action, but also sense a duration and pressure associated with the touch or swipe action. In some embodiments, the multimedia component 708 includes a front camera and/or a rear camera. The front camera and/or the rear camera may receive external multimedia data when the device 700 is in an operation mode, such as a photographing mode or a video mode. Each of the front camera and the rear camera may be a fixed optical lens system or have focusing and optical zooming capabilities.

The audio component 710 is configured to output and/or input an audio signal. For example, the audio component 710 includes a Microphone (MIC), and the MIC is configured to receive an external audio signal when the device 700 is in the operation mode, such as a call mode, a recording mode and a voice recognition mode. The received audio signal may be further stored in the memory 704 or sent through the communication component 716. In some embodiments, the audio component 710 further includes a speaker configured to output the audio signal.

The I/O interface 712 provides an interface between the processing component 702 and a peripheral interface module, and the peripheral interface module may be a keyboard, a click wheel, a button or the like. The button may include, but not limited to: a home button, a volume button, a starting button and a locking button.

The sensor component 714 includes one or more sensors configured to provide status assessment in various aspects for the device 700. For instance, the sensor component 714 may detect an on/off status of the device 700 and relative positioning of components, such as a display and small keyboard of the device 700, and the sensor component 714 may further detect a change in a position of the device 700 or a component of the device 700, presence or absence of contact between the user and the device 700, orientation or acceleration/deceleration of the device 700 and a change in temperature of the device 700. The sensor component 714 may include a proximity sensor configured to detect presence of an object nearby without any physical contact. The sensor component 714 may also include a light sensor, such as a Complementary Metal Oxide Semiconductor (CMOS) or Charge Coupled Device (CCD) image sensor, configured for use in an imaging application. In some embodiments, the sensor component 714 may also include an acceleration sensor, a gyroscope sensor, a magnetic sensor, a pressure sensor or a temperature sensor.

The communication component 716 is configured to facilitate wired or wireless communication between the device 700 and another device. The device 700 may access a communication-standard-based wireless network, such as a Wireless Fidelity (Wi-Fi) network, a 2nd-Generation (2G) or 3rd-Generation (3G) network or a combination thereof. In an exemplary embodiment, the communication component 716 receives a broadcast signal or broadcast associated information from an external broadcast management system through a broadcast channel. In an exemplary embodiment, the communication component 716 further includes a Near Field Communication (NFC) module to facilitate short-range communication. For example, the NFC module may be implemented on the basis of a Radio Frequency Identification (RFID) technology, an Infrared Data Association (IrDA) technology, an Ultra-WideBand (UWB) technology, a BlueTooth (BT) technology and another technology.

In an exemplary embodiment, the device 700 may be implemented by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors or other electronic components, and is configured to execute the abovementioned method for fingerprint identification.

In an exemplary embodiment, there is also provided a non-transitory computer-readable storage medium including an instruction, such as the memory 704 including an instruction, and the instruction may be executed by the processor 718 of the device 700 to implement the abovementioned method. For example, the non-transitory computer-readable storage medium may be a ROM, a Compact Disc Read-Only Memory (CD-ROM), a magnetic tape, a floppy disc, an optical data storage device or the like.

Other embodiments of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A method for fingerprint identification, the method comprising:
   detecting whether the number of damaged pixel units in a fingerprint identification sensor reaches a preset threshold value, the damaged pixel units being physically damaged pixel units in the fingerprint identification sensor and being determined according to a pixel feature of each of the pixel units acquired in a preset photographic environment, wherein the pixel feature at least includes a brightness value and/or a contrast; and
   stopping identifying a fingerprint image acquired by the fingerprint identification sensor if the number of the damaged pixel units reaches the preset threshold value.

2. The method according to claim 1, wherein detecting whether the number of the damaged pixel units in the fingerprint identification sensor reaches the preset threshold value comprises:
   determining a coverage area of a fingerprint of a user in the fingerprint identification sensor according to the fingerprint image; and
   detecting whether the number of damaged pixel units in pixel units belonging to the coverage area reaches a first preset threshold value.

3. The method according to claim 1, wherein detecting whether the number of the damaged pixel units in the fingerprint identification sensor reaches the preset threshold value comprises:
   determining a usual acquisition area for a fingerprint of a user in the fingerprint identification sensor according to a habit of the user in using the fingerprint identification sensor and a fingerprint size of the user, the usual acquisition area being an area where a probability of acquiring the fingerprint of the user is higher than a preset probability; and
   detecting whether the number of damaged pixels in the usual acquisition area reaches a second preset threshold value.

4. The method according to claim 1, wherein detecting whether the number of the damaged pixel units in the fingerprint identification sensor reaches the preset threshold value comprises:
   determining an unusual acquisition area for a fingerprint of a user in the fingerprint identification sensor according to a habit of the user in using the fingerprint identification sensor and a fingerprint size of the user, the unusual acquisition area being an area other than a usual acquisition area and the usual acquisition area being an area where a probability of acquiring the fingerprint of the user is higher than a preset probability; and
   detecting whether the number of damaged pixels in the unusual acquisition area reaches a third preset threshold value.

5. The method according to claim 1, wherein detecting whether the number of the damaged pixel units in the fingerprint identification sensor reaches the preset threshold value comprises:
  determining a usual acquisition area and an unusual acquisition area for a fingerprint of a user in the fingerprint identification sensor according to a habit of the user in using the fingerprint identification sensor and a fingerprint size of the user, the usual acquisition area being an area where a probability of acquiring the fingerprint of the user is higher than a preset probability and the unusual acquisition area being an area other than the usual acquisition area; and
  detecting whether the number of damaged pixels in the usual acquisition area reaches a second preset threshold value and whether the number of damaged pixels in the unusual acquisition area reaches a third preset threshold value, the third preset threshold being greater than the second preset threshold value.

6. The method according to claim 1, further comprising:
  extracting feature points in the fingerprint image if there is no damaged pixel unit or the number of the damaged pixel units does not reach the preset threshold value;
  detecting whether the number of unreliable feature points in the feature points reaches a preset number, the unreliable feature points being feature points acquired by the damaged pixel units or pixel units in an abnormal working sate, wherein the pixel units in the abnormal working state refer to pixel units with are not physically damaged but become abnormal when acquiring pixel points in the fingerprint identification sensor; and
  stopping identifying the fingerprint image acquired by the fingerprint identification sensor if the number of the unreliable feature points reaches the preset number.

7. A device for fingerprint identification, the device comprising:
  a processor; and
  a memory configured to store instructions executable by the processor,
  wherein the processor is configured to:
  detect whether the number of damaged pixel units in a fingerprint identification sensor reaches a preset threshold value, the damaged pixel units being physically damaged pixel units in the fingerprint identification sensor and being determined according to a pixel feature of each of the pixel units acquired in a preset photographic environment, wherein the pixel feature at least includes a brightness value and/or a contrast; and
  stop identifying a fingerprint image acquired by the fingerprint identification sensor if the number of the damaged pixel units reaches the preset threshold value.

8. The device according to claim 7, wherein the processor configured to detect whether the number of damaged pixel units in a fingerprint identification sensor reaches a preset threshold value is further configured to:
  determine a coverage area of a fingerprint of a user in the fingerprint identification sensor according to the fingerprint image; and
  detect whether the number of damaged pixel units in pixel units belonging to the coverage area reaches a first preset threshold value.

9. The device according to claim 7, wherein the processor configured to detect whether the number of damaged pixel units in a fingerprint identification sensor reaches a preset threshold value is further configured to:
  determine a usual acquisition area for a fingerprint of a user in the fingerprint identification sensor according to a habit of the user in using the fingerprint identification sensor and a fingerprint size of the user, the usual acquisition area being an area where a probability of acquiring the fingerprint of the user is higher than a preset probability; and
  detect whether the number of damaged pixels in the usual acquisition area reaches a second preset threshold value.

10. The device according to claim 7, wherein the processor configured to detect whether the number of damaged pixel units in a fingerprint identification sensor reaches a preset threshold value is further configured to:
  determine an unusual acquisition area for a fingerprint of a user in the fingerprint identification sensor according to a habit of the user in using the fingerprint identification sensor and a fingerprint size of the user, the unusual acquisition area being an area other than a usual acquisition area and the usual acquisition area being an area where a probability of acquiring the fingerprint of the user is higher than a preset probability; and
  detect whether the number of damaged pixels in the unusual acquisition area reaches a third preset threshold value.

11. The device according to claim 7, wherein the processor configured to detect whether the number of damaged pixel units in a fingerprint identification sensor reaches a preset threshold value is further configured to:
  determine a usual acquisition area and an unusual acquisition area for a fingerprint of a user in the fingerprint identification sensor according to a habit of the user in using the fingerprint identification sensor and a fingerprint size of the user, the usual acquisition area being an area where a probability of acquiring the fingerprint of the user is higher than a preset probability and the unusual acquisition area being an area other than the usual acquisition area; and
  detect whether the number of damaged pixels in the usual acquisition area reaches a second preset threshold value and whether the number of damaged pixels in the unusual acquisition area reaches a third preset threshold value, the third preset threshold being greater than the second preset threshold value.

12. The device according to claim 7, wherein the processor is further configured to:
  extract feature points in the fingerprint image if there is no damaged pixel unit or the number of the damaged pixel units does not reach the preset threshold value;
  detect whether the number of unreliable feature points in the feature points reaches a preset number, the unreliable feature points being feature points acquired by the damaged pixel units or pixel units in an abnormal working sate, wherein the pixel units in the abnormal working state refer to pixel units which are not physically damaged but become abnormal when acquiring pixel points in the fingerprint identification sensor; and
  stop identifying the fingerprint image acquired by the fingerprint identification sensor if the number of the unreliable feature points reaches the preset number.

13. A non-transitory computer-readable storage medium having stored therein instructions that, when executed by a processor of a mobile terminal, causes the mobile terminal to perform a method for fingerprint identification, the method comprising:

detecting whether the number of damaged pixel units in a fingerprint identification sensor reaches a preset threshold value, the damaged pixel units being physically damaged pixel units in the fingerprint identification sensor and being determined according to a pixel feature of each of the pixel units acquired in a preset photographic environment, wherein the pixel feature at least includes a brightness value and/or a contrast; and stopping identifying a fingerprint image acquired by the fingerprint identification sensor if the number of the damaged pixel units reaches the preset threshold value.

\* \* \* \* \*